(12) United States Patent
Huang et al.

(10) Patent No.: US 7,008,866 B2
(45) Date of Patent: Mar. 7, 2006

(54) LARGE-SCALE TRIMMING FOR ULTRA-NARROW GATES

(75) Inventors: Ming-Jie Huang, Hsinchu (TW);
Shu-Chih Yang, Hsinchu (TW);
Huan-Just Lin, Hsin-Chu (TW);
Yung-Tin Chen, Hsinchu (TW);
Hun-Jan Tao, Hsinchu (TW)

(73) Assignee: Taiwan Semiconductor Manufacturing Co Ltd., Hsin Chu (TW)

( * ) Notice: Subject to any disclaimer, the term of this patent is extended or adjusted under 35 U.S.C. 154(b) by 82 days.

(21) Appl. No.: 10/738,239

(22) Filed: Dec. 17, 2003

(65) Prior Publication Data

US 2005/0133827 A1      Jun. 23, 2005

(51) Int. Cl.
*H01L 21/3205*      (2006.01)

(52) U.S. Cl. .................... 438/585; 430/316; 430/30; 430/311; 430/313; 430/317; 430/329; 438/714; 438/725

(58) Field of Classification Search ................ 430/316, 430/30, 311, 313, 317, 329; 438/714, 725
See application file for complete search history.

(56) References Cited

U.S. PATENT DOCUMENTS 6,864,041 B1 * 3/2005 Brown et al. ............... 430/316

* cited by examiner

*Primary Examiner*—Mai-Huong Tran
(74) *Attorney, Agent, or Firm*—Tung & Assoc

(57) ABSTRACT

Large-scale trimming for forming ultra-narrow gates for semiconductor devices is disclosed. A hard mask layer on a semiconductor wafer below a patterned soft mask layer on the semiconductor wafer is etched to narrow a width of the hard mask layer. The hard mask layer is trimmed to further narrow the width of the hard mask layer, where the soft mask layer has been removed. At least a gate electrode layer below the hard mask layer on the semiconductor wafer is etched, resulting in the gate electrode layer having a width substantially identical to the width of the hard mask layer as trimmed. The gate electrode layer as etched forms the ultra-narrow gate electrode on the semiconductor wafer, where the hard mask layer has been removed.

12 Claims, 12 Drawing Sheets

LARGE-SCALE TRIMMING FOR ULTRA-NARROW GATES

FIELD OF THE INVENTION

This invention relates generally to semiconductor device fabrication, and more particularly to fabrication of such devices that have narrow and ultra-narrow gates.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvement in overlay tolerances in photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

One feature that has particularly decreased in size is the transistor gate. A gate is the control electrode in a field-effect transistor (FET). A voltage applied to the gate regulates the conducting properties of the semiconductor channel region, which is usually located directly beneath the gate. In a MESFET (metal semiconductor field effect transistor), the gate is in intimate contact with the semiconductor. In a MOSFET (metal oxide semiconductor field effect transistor), it is separated from the semiconductor by a thin oxide, typically 100–1000 angstroms thick.

Most current semiconductor fabrication processes can achieve gates that have a width no smaller than 0.05 micron. These processes may use photoresist dry trimming to achieve so-called narrow gates of this width. Photoresist trimming is the process by which photoresist that has been applied to a semiconductor substrate is exposed to an exposure light source according to a pattern, developed to remove the part of the photoresist that was exposed, and finally further trimmed to remove even more of the photoresist. The part of the photoresist that was not exposed because it was beneath under opaque regions of the pattern during exposure usually remains. The polysilicon or other material deposited on the substrate below the photoresist is then trimmed to form gates and other features within the polysilicon.

Patterning and trimming can be dry etching or wet etching processes. Wet etching refers to the use of wet chemical processing to selectively remove the material from the wafer. The chemicals are placed on the surface of the wafer, or the wafer itself is submerged in the chemicals. Dry etching refers to the use of plasma stripping, using a gas such as oxygen ($O_2$), $C_2F_6$ and $O_2$, or another gas. Whereas wet etching is a low-temperature process, dry etching is typically a high-temperature process.

U.S. Pat. No. 6,174,818 describes one approach to photoresist trimming to achieve narrow gate electrodes. As shown in FIG. 1A, on top of a silicon wafer substrate 102 is deposited, in order, a stop layer 104, a polysilicon layer 106 from which ultimately a gate will be formed, a hard mask layer 108, and a (soft) photoresist layer 110. The stop layer 104 is typically a type of oxide, and prevents etchant from removing material beyond the stop layer 104. The hard mask layer 108 may be silicon dioxide, silicon nitride, an inorganic anti-reflecting coating (ARC), or another type of hard mask.

The photoresist layer 110 is exposed to a light source through a pattern, and then etched by a development process to remove those parts of the layer 110 that were exposed to the light source, so that only those parts of the layer 110 that were not exposed to the light source remain. The resulting photoresist layer 110 is then further trimmed to remove more of the layer 110. This is shown in FIG. 1B. The photoresist layer 110 has a smaller width in FIG. 1B as compared to in FIG. 1A, and also has some decrease in its height. The smaller width results from the parts of the layer 110 that were exposed to the light source being completely removed via development, and then trimming some of the remaining photoresist layer 110 to achieve a still narrower part of the layer 110 that remains. Trimming removes some of the height of the photoresist layer 110, which is why the layer 110 has a smaller height in FIG. 1B than in FIG. 1A.

The hard mask layer 108 is next etched to remove the exposed parts of the hard mask layer 108 that are not beneath the remaining photoresist layer 110. This is shown in FIG. 1C. The hard mask layer 108 has a width substantially equal to that of the photoresist layer 110. The etching that removes the exposed parts of the hard mask layer 108 also removes some more of the remaining photoresist layer 110. The layer 110 in FIG. 1C therefore has a smaller height than it does in FIG. 1B. The remaining photoresist layer 110 is then removed, as shown in FIG. 1D, such as by a photoresist stripping process.

The polysilicon layer 106 is next etched via a gate etching process to remove the exposed parts of the layer 106 that are not beneath the remaining hard mask layer 108. This is shown in FIG. 1E. The etching forms the gate within the polysilicon layer 106, so that the layer 106 has a width corresponding to the width of the hard mask layer 108 that remains. The stop layer 104 is also etched to substantially the silicon substrate 102. The stop layer 104 acts to stop the etching process from etching the substrate 102 itself, where etching of the thin layer 104 is slower than the thicker layer 106. Finally, the hard mask layer 108 is removed, as shown in FIG. 1F, resulting in the finished gate as the remaining polysilicon layer 106, on top of the stop layer 104 and the substrate 102.

The photoresist trimming that results in FIG. 1B is referred to as critical dimension (CD) trimming. This is because it is the process that defines the CD of the semiconductor device being fabricated, the gate in the remaining polysilicon layer 106 in FIG. 1F. That is, the width of the polysilicon layer 106 in FIG. 1F is substantially identical to the width of the hard mask layer 108 in FIG. 1E, which itself is substantially identical to the width of the photoresist layer 110 in FIG. 1B. Controlling the width of the photoresist layer 110 during photoresist trimming from FIG. 1A to FIG. 1B thus ultimately controls the width of the gate in the polysilicon layer 106 in FIG. 1F. The gate width is a CD of the semiconductor device being fabricated, where a CD is generally defined as a geometry or space used as a gauge to monitor the pattern size and ensure that it is within a customer's specification.

However, photoresist trimming can only trim about 0.05 micron from the width of a photoresist layer, limiting how narrow the width of a gate can be fabricated. Where the width of the photoresist layer is initially 0.11 micron, for instance, this means that the narrowest the CD width of a gate that can be fabricated is 0.06 micron. This is problematic, because new semiconductor device designs may require a gate with a much smaller width. For example, some new semiconductor device designs may require a gate having a width of 0.035 micron. Furthermore, even achieving photoresist trimming of about 0.05 micron is difficult, because local pattern density and other effects may cause defects in the semiconductor devices resulting from such large-scale trimming.

Local pattern density effects are those that result from some semiconductor features being less or more dense in a desired pattern than other features. For example, in an etch process that forms metal lines by etching all but narrow strips of a blanket metal layer, isolated lines of a given designed width may end up wider on the wafer than densely-packed lines of the same designed width due to etch-loading. This results in variation of similarly designed features on the resulting semiconductor device depending on the density of those features in the desired pattern. Other pattern density effects include metal, such as copper and aluminum, recession, dielectric erosion, feature edge rounding, and large-scale feature non-uniformities.

The limit to which photoresist trimming can be achieved is thus substantially 0.05 micron, assuming that local pattern density and other effects can be otherwise controlled. This is shown in the graph 200 of FIG. 2. The x-axis 202 measures trimming time in seconds, whereas the y-axis 204 measures CD bias, which corresponds to in absolute terms the amount of photoresist width that can be trimmed, in nanometers (nm). As indicated by the line 206, acceptable photoresist trimming can be accomplished for a duration between 40 seconds, as denoted by the point 208, and 100 seconds, as denoted by the point 210. At 40 seconds, at the point 208, photoresist trimming results in a CD bias of little less than −20 nm, which corresponds to 0.02 micron of the photoresist width being trimmed. The CD bias increases in absolute terms until it reaches 100 seconds, at the point 210, at which photoresist trimming results in a CD bias of nearly −50 nm. This corresponds to 0.05 micron of the photoresist width being trimmed.

U.S. Pat. No. 6,013,570 describes a solution to avoid the local pattern density effects that can result from the wide-scale photoresist trimming of U.S. Pat. No. 6,174,818 that has been described with reference to FIGS. 1A–1F. First, as shown in FIG. 3A, on top of a silicon wafer substrate 302 is deposited, in order, a stop layer 304, a polysilicon layer 306 from which ultimately a gate will be formed, a hard mask layer 308, and a (soft) photoresist layer 310. The stop layer 304 is typically a type of oxide, and prevents etchant from removing material beyond the stop layer 304. The hard mask layer 308 may be silicon dioxide, silicon nitride, an inorganic ARC, or another type of hard mask.

The photoresist layer 310 is exposed to a light source through a pattern, and then developed to remove those parts of the layer 310 that were exposed to the light source, so that only those parts of the layer 310 that were not exposed to the light source remain. This is shown in FIG. 3B. The photoresist layer 310 has a smaller width in FIG. 3B as compared to in FIG. 3A. The smaller width results from the parts of the layer 310 that were exposed to the light source being completely removed.

The hard mask layer 308 is next etched to remove the exposed parts of the hard mask layer 308 that are not beneath the remaining photoresist layer 310. This is shown in FIG. 3C. The hard mask layer 308 has a width substantially equal to that of the photoresist layer 310. The etching that removes the exposed parts of the hard mask layer 308 also removes some of the remaining photoresist layer 310. The layer 310 in FIG. 3C therefore has a smaller height than it does in FIG. 3B.

The polysilicon layer 306 is next etched via a gate etching process to remove the exposed parts of the layer 306 that are not beneath the remaining polysilicon layer 310 and the remaining hard mask layer 308. This is shown in FIG. 3D. The etching forms the gate within the polysilicon layer 306, so that the layer 306 has a width corresponding to the width of the hard mask layer 308 that remains. The stop layer 304 acts to stop the etching process from etching the substrate 302 itself. The etching that removes the exposed parts of the polysilicon layer 306 also removes some more of the remaining photoresist layer 310, which is why the layer 306 has a smaller height in FIG. 3D than in FIG. 3C.

The remaining photoresist 306 is then removed, such as by using a photoresist stripping process, and the width of the polysilicon layer 306 is further decreased by isotropic etching. This is shown in FIG. 3E. The isotropic etching does not affect the width of the stop layer 304, however, such that the stop layer 304 serves to prevent the isotropic etching from etching the substrate 302. Finally, the hard mask layer 308 is removed, as shown in FIG. 3F, resulting in the finished gate as the remaining polysilicon layer 306, on top of the stop layer 304 and the substrate 302. The removal of the hard mask layer 308 may also remove the parts of the stop layer 304 that are not directly beneath the layer 306, such that the stop layer 304 again serves to protect the substrate 302 from being removed.

The width of the resulting gate formed in the polysilicon layer 306 in FIG. 3F is substantially the same as that of the resulting gate formed in the polysilicon layer 106 in FIG. 1F. The photoresist patterning resulting in FIG. 3B results in less width of the photoresist layer 310 being removed than the width of the photoresist layer 110 in FIG. 1B resulting from photoresist trimming. To achieve the same resulting gate width, the approach that has been immediately described performs its CD process by the isotropic etching of the polysilicon layer 306 that results in FIG. 3E. The isotropic etching resulting in FIG. 3E is thus referred to as CD etching, because it is the process that defines the CD of the semiconductor device being fabricated, the gate in the remaining polysilicon layer 306 in FIG. 3F.

The approach of U.S. Pat. No. 6,013,570 described with reference to FIGS. 3A–3F avoids the local pattern density effects that can result from large-scale photoresist removal, such as that which the approach of U.S. Pat. No. 6,174,818 described with reference to FIGS. 1A–1F accomplishes. This is because the former approach avoids having to remove as much photoresist by the patterning that results in FIG. 3B as the latter approach does by the patterning and trimming that results in FIG. 1B. However, the approach of U.S. Pat. No. 6,013,570 is still disadvantageous, owing to its reliance on isotropic etching the polysilicon layer 306 as the CD process that results in FIG. 3E.

Isotropic etching, in the context of FIG. 3E, is the removal by etchant of the polysilicon layer 306 even beneath the hard mask layer 308. Isotropic etching is controlled only with difficulty. Over etching may result, which is more isotropic etching than desired. Furthermore, too much isotropic etching can result in lifting of the hard mask layer 308, such that the polysilicon layer 306 is significantly etched even directly beneath the hard mask layer 308, as a result of the layer 308 peeling upward. Isotropic etching uses a non-selective etchant, which in high-density devices having multiple layer stacks can result in microloading. Microloading is a change in the local etch rate relative to the area of material being removed, which also causes the isotropic etching resulting in FIG. 3E to be difficult to control. To this end, using isotropic etching to avoid the local pattern density effects of large-scale photoresist trimming effectively replaces one set of problems and difficulties with another.

In any case, neither the approach of U.S. Pat. No. 6,174,818, nor the approach of U.S. Pat. No. 6,013,570, can achieve a gate width of substantially less than 0.06 micron when beginning with a photoresist layer having an initial width of 0.11 micron. Whereas the former approach may experience local pattern density effects, the latter approach may experience isotropic etching difficulties. Neither approach, however, typically provides for the fabrication of ultra-narrow transistor gates, generally defined as gates resulting from (soft) photoresist and/or hard mask trimming in excess of 0.05 micron. For example, starting with photoresist and hard layers having an initial width of 0.11 micron, such ultra-narrow gates may have a width less than 0.06 micron, and perhaps as narrow 0.035 micron. For this and other reasons, therefore, there is a need for the present invention.

SUMMARY OF THE INVENTION

The invention relates to large-scale trimming to form ultra-narrow gates in semiconductor devices. A semiconductor wafer has, in order from bottom to top, a gate dielectric layer, a gate electrode layer, a hard mask layer, and a soft mask layer. The soft mask layer is patterned. The hard mask layer is etched, resulting in the hard mask layer having a width substantially identical to the width of the soft mask layer as patterned. The soft mask layer is removed. The hard mask layer is trimmed to further narrow its width. The gate electrode layer, and optionally the gate dielectric layer, are etched, so that the gate electrode layer has a width substantially identical to the width of the hard mask layer as trimmed. The gate electrode layer as etched is the ultra-narrow gate electrode on the semiconductor wafer. The hard mask layer is finally removed.

Embodiments of the invention provide for advantages over the prior art. Greater than 0.05 micron, and preferably 0.075 micron, of width in the gate electrode layer is removed as a result of etching the gate electrode layer after a substantially identical width of the hard mask layer is removed by etching and trimming. This large-scale trimming results in an ultra-narrow gate being formed in the gate electrode layer. Where the gate electrode layer before etching has a width of 0.11 micron, after etching it can have a narrow width of 0.035 micron, substantially narrower than that provided by the prior art. The local pattern density effects of U.S. Pat. No. 6,174,818 are avoided because large-scale soft (photoresist) layer patterning is avoided. The problems associated with U.S. Pat. No. 6,013,570 are avoided, because substantial isotropic etching of the gate electrode (polysilicon) layer is also avoided.

Other advantages, embodiments, and aspects of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1A:
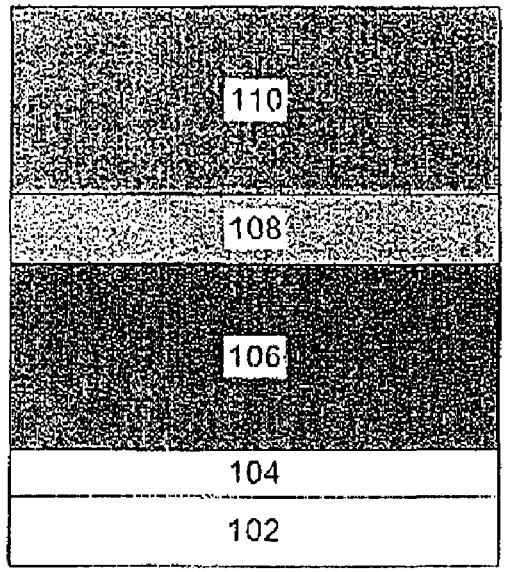
FIGS. 1A, 1B, 1C, 1D, 1E, and 1F are diagrams showing the performance of the approach described in U.S. Pat. No. 6,174,818 to achieve a narrow transistor gate.
Figure 1B:
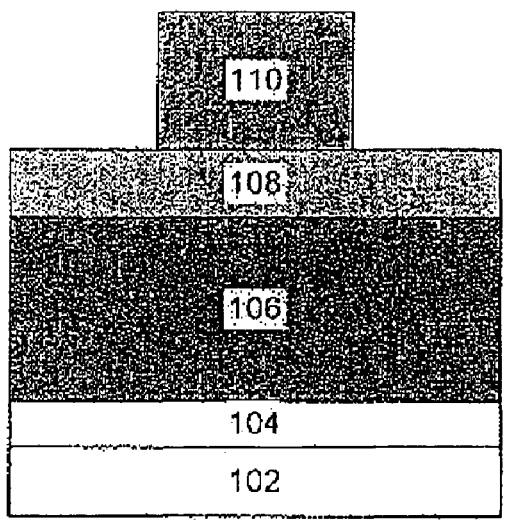
Figure 1C:
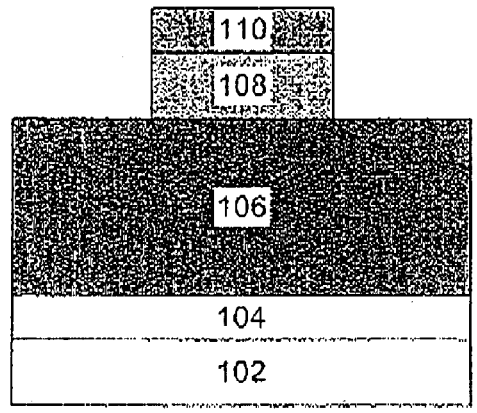
Figure 1D:
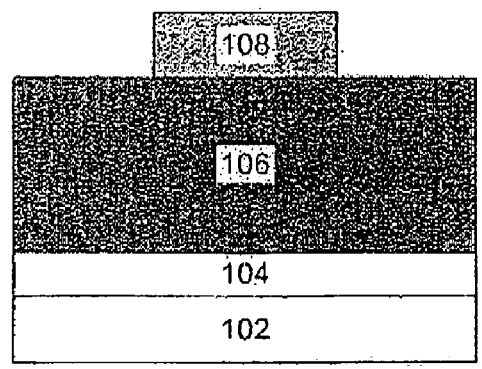
Figure 1E:
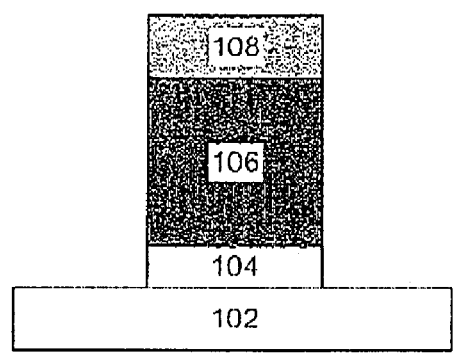
Figure 1F:
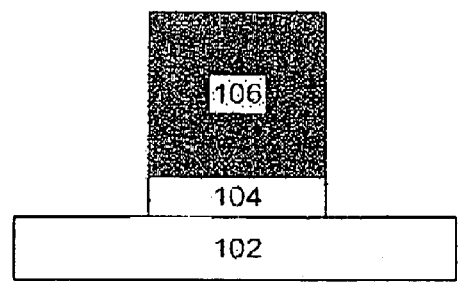
Figure 2:
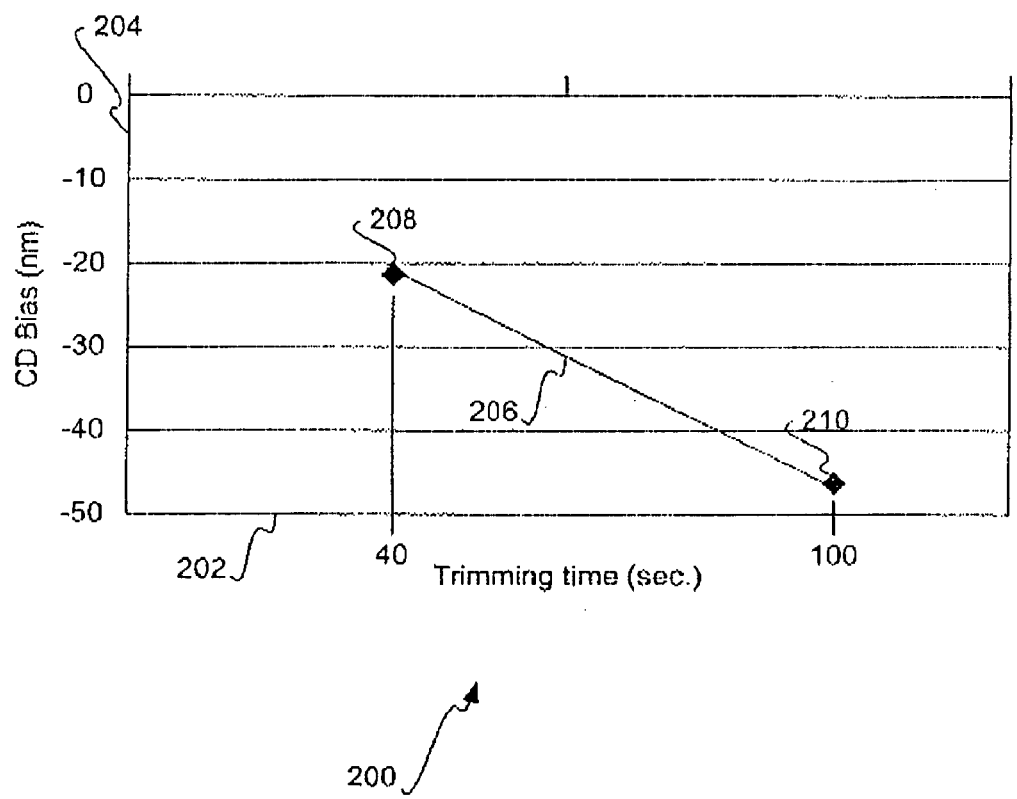
FIG. 2 is a graph showing the limits to which large-scale photoresist trimming can be accomplished.
Figure 3A:
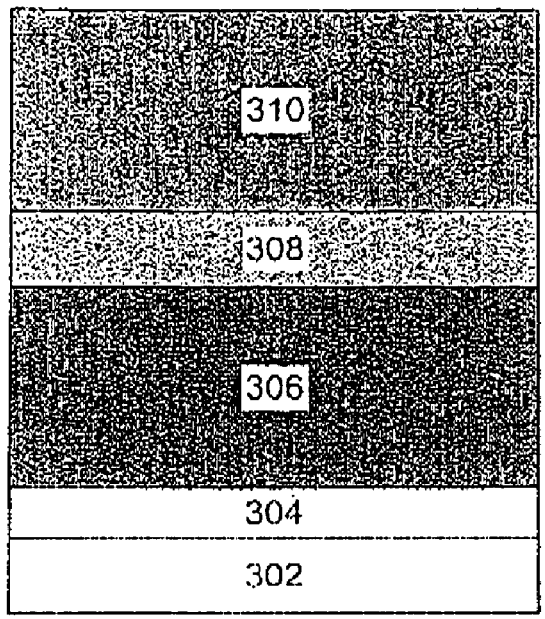
FIGS. 3A, 3B, 3C, 3D, 3E, and 3F are diagrams showing the performance of the approach described in U.S. Pat. No. 6,013,570 to achieve a narrow transistor gate.
Figure 3B:
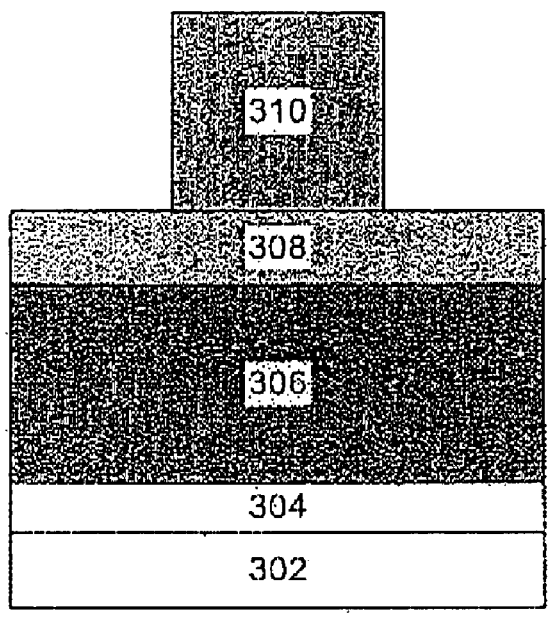
Figure 3C:
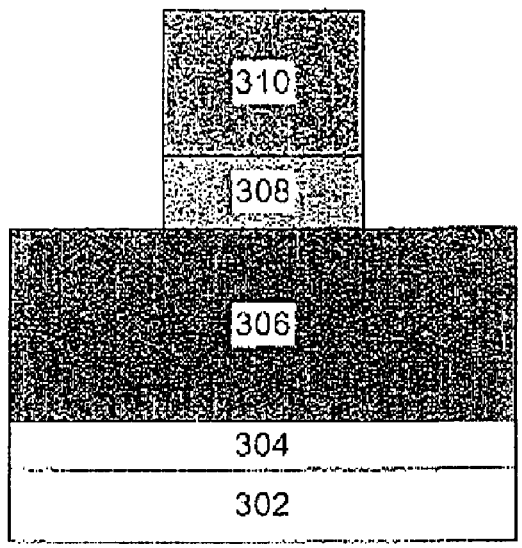
Figure 3D:
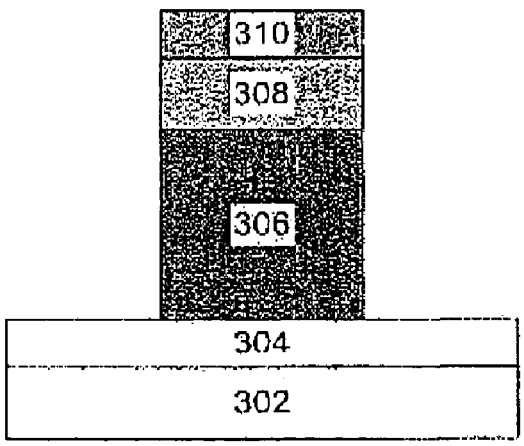
Figure 3E:
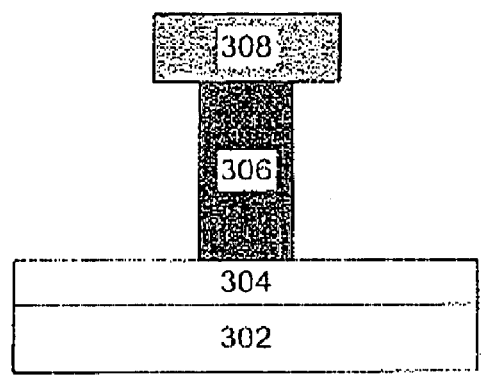
Figure 3F:
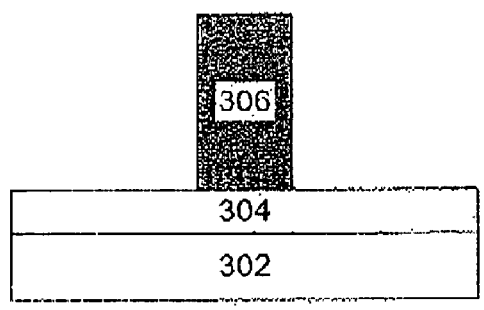
Figure 4:
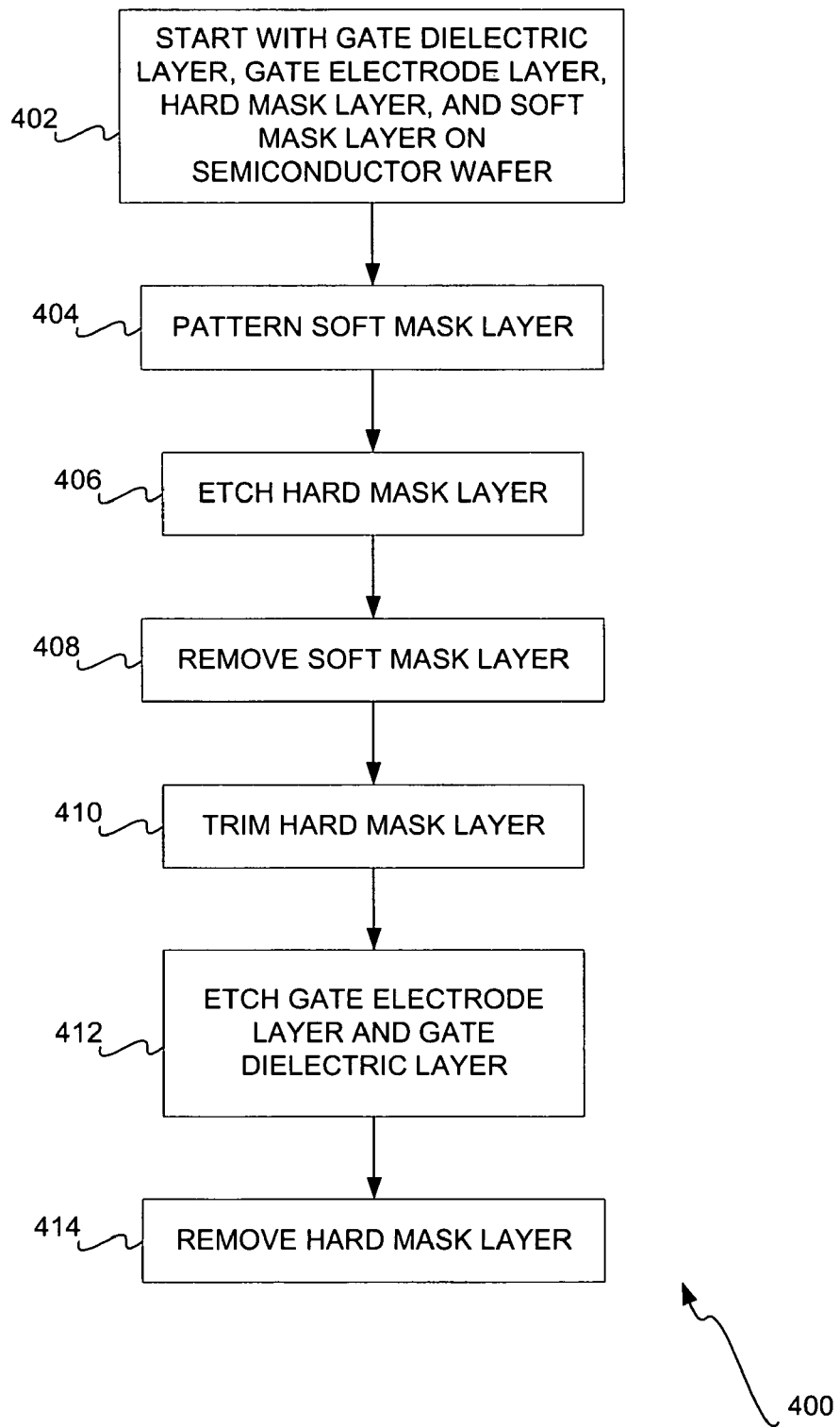
FIG. 4 is a flowchart of a method to achieve an ultra-narrow transistor gate, according to an embodiment of the invention.
Figure 5A:
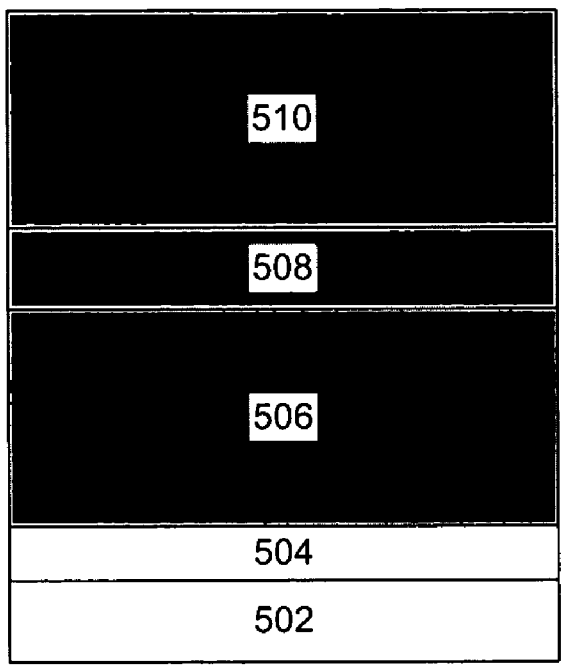
FIGS. 5A, 5B, 5C, 5D, 5E, 5F, and 5G are diagrams showing the performance of the method of FIG. 4 to achieve an ultra-narrow transistor gate, according to an embodiment of the invention.

FIG. 4 shows a method 400 according to which an embodiment of the invention can form an ultra-narrow gate on a semiconductor device. The method 400 starts with a semiconductor wafer having deposited thereon from bottom to top, a gate dielectric layer, a gate electrode layer, a hard mask layer, and a soft mask layer (402). This may be accomplished by depositing or otherwise providing each of these layers in succession on the wafer. The resulting wafer is shown in FIG. 5A, where the wafer substrate 502 has a gate dielectric layer 504, a gate electrode layer 506, a hard mask layer 508, and a soft mask layer 510. The gate dielectric layer 504 may be an oxide or nitride layer, and may optionally have an inorganic anti-reflective coating (ARC) thereon. The gate electrode layer 506 may be a doped or undoped polysilicon layer. The hard mask layer 508 may be a silicon dioxide, silicon nitride, or an inorganic ARC layer. The soft mask layer 510 may be a photoresist layer.

Figure 5B:
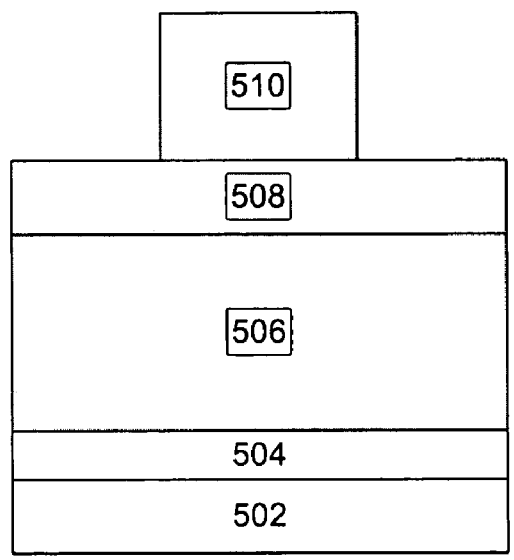

Referring back to FIG. 4, the soft mask layer is patterned (404). Patterning may be accomplished by a photolithographic process, such as one that first exposes the soft mask layer to a light source through a photomask, such as a reticle, and then develops the soft mask layer to remove the layer as exposed to the light source, and leaving the layer as unexposed to the light source. The result of the patterning is shown in FIG. 5B, in which the soft mask layer 510 has been patterned to have a narrower width than before it was patterned.

Figure 5C:
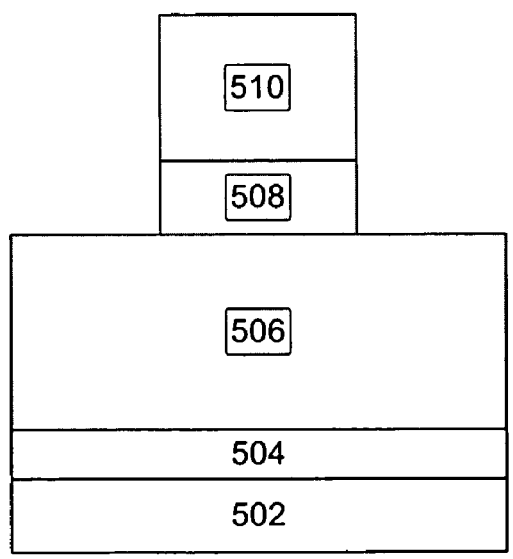

Referring back to FIG. 4, the hard mask layer is etched (406). This results in the hard mask layer having a width substantially identical to the width of the soft mask layer as patterned. Etching may be performed by reactive-ion etching (RIE), using an inductive coupled plasma (ICP) process. Some oxygen ashing may result. The result of the etching is shown in FIG. 5C, in which the hard mask layer 508 has been etched to have the same width as the soft mask layer 510. Furthermore, the etching process may remove some of the height of the soft mask layer 510, as shown in FIG. 5C.

Referring back to FIG. 4, the soft mask layer is removed (408). This may be accomplished by photoresist stripping the soft mask layer, where the soft mask layer is photoresist.

Figure 5D:
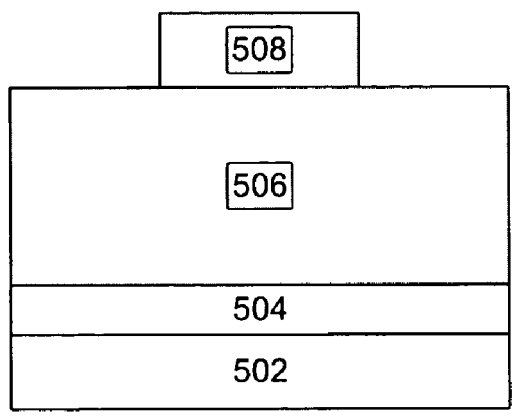

The result of the soft mask layer removal is shown in FIG. 5D, in which the soft mask layer 510 of FIG. 5C is no longer present.

Figure 5E:
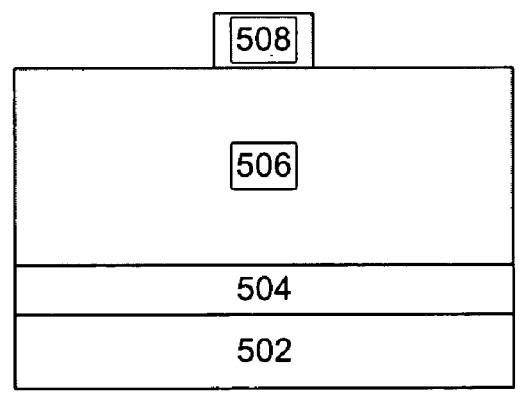

Referring back to FIG. 4, the hard mask layer is trimmed (410). Trimming further narrows the width of the hard mask layer, where the etching of the hard mask layer had previously initially trimmed the width of the hard mask layer. Trimming may be accomplished by wet etching, such as by using a $H_3PO_4$ solution, or dry etching. Trimming may remove some of the height of the hard mask layer, in addition to its width. For this reason, the hard mask layer may initially have a thickness, or height, between 700 and 800 angstrom, as compared to a thickness of 400 angstrom as in the prior art. Wet etching can result in the width of the hard mask layer being as narrow as 30 nanometers. The etching is primarily anistropic, where only the sides of the hard mask layer are etched, but preferably also includes some isotropic etching, where the top of the layer is etched. This can be accomplished by having a bias power between zero and ten watts. The result of the hard mask layer trimming is shown in FIG. 5E, in which the hard mask layer 508 has a narrower width than in FIG. 5D, and further has some decrease in height.

Figure 5F:
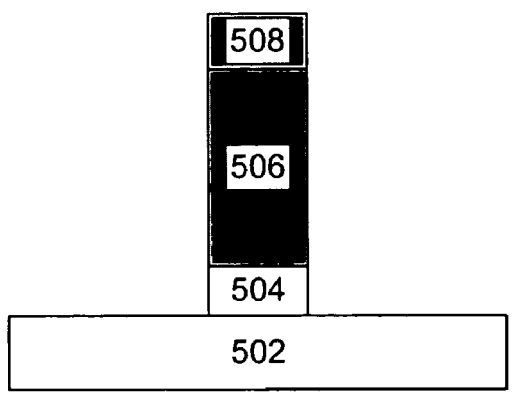

Referring back to FIG. 4, the gate electrode, and optionally the gate dielectric, layers are etched (412). This results in the gate electrode layer and optionally the gate dielectric layer having a width substantially identical to the width of the hard mask layer as trimmed. The gate electrode layer as etched is the ultra-narrow gate electrode of the semiconductor device being fabricated. The gate dielectric layer may also be etched, where this layer serves as a stop layer so that the underlying substrate is not etched. Some of the height of hard mask layer, such as one-half thereof, may also be removed by this etching process. However, a minimum of 100 angstrom in height of the hard mask layer preferably remains, to avoid shouldering, or corner rounding, of the gate. The etching process may be performed by a lithographic and/or another process. The result of the gate electrode layer etching is shown in FIG. 5F, in which the gate electrode layer 506 and the gate dielectric layer 504 each have a width substantially identical to that of the hard mask layer 508, and the height of the hard mask layer 508 has been reduced as compared to in FIG. 5E.

Figure 5G:
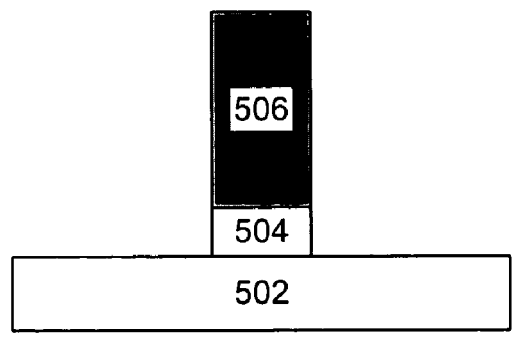

Referring back to FIG. 4, the hard mask layer is finally removed (414). This results in only the gate electrode layer and the gate dielectric layer remaining on the semiconductor wafer substrate, where the gate electrode layer has been formed into the gate electrode of the semiconductor device being fabricated. This is shown in FIG. 5G, in which the ultra-narrow gate electrode of the device is the gate electrode layer 506, which is over the gate dielectric layer 504 on the substrate 502. The hard mask layer 508 remaining in FIG. 5F has been removed in FIG. 5G.

The resulting ultra-narrow gate electrode formed by performance of the method 400 of FIG. 4 is such that greater than 50 nanometers in width of the gate electrode layer can be removed. More than 70 nanometers in width in fact can be removed by the method 400. For example, starting with an initial width of 110 nanometers, 75 nanometers of the gate electrode layer can be removed to form an ultra-narrow gate electrode having a width of only 35 nanometers. The removal is specifically provided by the gate etching of 412 as shown in FIG. 5F, where the part of the gate electrode layer not beneath the hard mask layer is removed. The narrow width of the hard mask layer, to which the width of the gate electrode layer is substantially identically etched, is achieved by the hard mask trimming of 410 shown in FIG. 5E, and the hard mask etching of 406 shown in FIG. 5C. The hard mask etching specifically results in narrowing of the hard mask layer to a width substantially identical to that of a patterned soft mask layer, resulting from the patterning of 404 shown in FIG. 5B.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. For example, cleaning processes may be performed before and/or after the various steps, acts, and actions of the method 400 of FIG. 4, as can be appreciated by those of ordinary skill within the art. Therefore, it is manifestly intended that this invention be limited only by the claims and equivalents thereof.

What is claimed is:

1. A method for forming an ultra-narrow gate electrode on a semiconductor wafer comprising:

patterning a soft mask layer on the semiconductor wafer also having a hard mask layer beneath the soft mask layer, a gate electrode layer beneath the hard mask layer, and a gate dielectric layer beneath the gate electrode layer;

etching the hard mask layer, resulting in the hard mask layer having a width substantially identical to a width of the soft mask layer as patterned;

removing the soft mask layer;

trimming the hard mask layer to further narrow the width of the hard mask layer;

etching at least the gate electrode layer, such that at least the gate electrode layer has a width substantially identical to the width of the hard mask layer as trimmed, the gate electrode layer as etched being the ultra-narrow gate electrode on the semiconductor wafer; and, removing the hard mask layer.

2. The method of claim 1, further initially comprising:

providing the gate dielectric layer on the semiconductor wafer;

providing the gate electrode layer over the gate dielectric layer;

providing the hard mask layer over the gate electrode layer; and, providing the soft mask layer over the hard mask layer.

3. The method of claim 1, wherein patterning the soft mask layer comprises:

exposing the soft mask layer to a light source through a photomask; and, developing the soft mask layer to remove the soft mask layer as exposed to the light source, such that the soft mask layer as unexposed to the light source remains.

4. The method of claim 1, wherein etching the hard mask layer comprises at least one of reactive-ion etching (RIE) the hard mask layer and using an inductive coupled plasma (ICP) process to etch the hard mask layer.

5. The method of claim 1, wherein removing the soft mask layer comprises stripping the soft mask layer.

6. The method of claim 1, wherein trimming the hard mask layer comprises one of wet etching and dry etching the hard mask layer.

7. The method of claim 1, wherein etching at least the gate electrode layer comprises also etching the gate dielectric layer to the semiconductor wafer.

8. The method of claim 1, wherein etching at least the gate electrode layer comprises also removing some height of the hard mask layer.

9. The method of claim 1, wherein the soft mask layer comprises a photoresist layer.

10. The method of claim 1, wherein the hard mask layer comprises one of silicon dioxide, silicon nitride, and an inorganic anti-reflecting coating (ARC).

11. The method of claim 1, wherein the gate electrode layer comprises a polysilicon layer.

12. The method of claim 1, wherein the gate dielectric layer comprises an oxide layer.

* * * * *